United States Patent
Lee et al.

(10) Patent No.: US 8,415,804 B2
(45) Date of Patent: Apr. 9, 2013

(54) SEMICONDUCTOR CHIP, METHOD OF FABRICATING THE SAME, AND STACK MODULE AND MEMORY CARD INCLUDING THE SAME

(75) Inventors: Ho-jin Lee, Seoul (KR); Dong-hyun Jang, Suwon-si (KR); In-young Lee, Yongin-si (KR); Min-seung Yoon, Seoul (KR); Son-kwan Hwang, Suwon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 291 days.

(21) Appl. No.: 12/639,241

(22) Filed: Dec. 16, 2009

(65) Prior Publication Data
US 2010/0327422 A1    Dec. 30, 2010

(30) Foreign Application Priority Data

Jun. 29, 2009   (KR) .................. 10-2009-0058315

(51) Int. Cl.
*H01L 23/48* (2006.01)
*H01L 23/52* (2006.01)
*H01L 29/40* (2006.01)
*H01L 21/44* (2006.01)

(52) U.S. Cl.
USPC .... 257/774; 257/758; 257/775; 257/E21.579; 257/E21.578; 257/E21.585; 438/637; 438/673

(58) Field of Classification Search .................. 438/637, 438/673, 675; 257/758, 774, 775, E21.579, 257/E21.578, E21.585
See application file for complete search history.

(56) References Cited

U.S. PATENT DOCUMENTS

| | | | |
|---|---|---|---|
| 7,354,856 B2 * | 4/2008 | Yeh et al. ........................ | 438/638 |
| 7,521,358 B2 * | 4/2009 | Bright et al. ................... | 438/637 |
| 7,633,167 B2 * | 12/2009 | Kawano et al. ............... | 257/774 |
| 2001/0051411 A1 * | 12/2001 | Ito et al. ........................ | 438/268 |
| 2004/0061238 A1 * | 4/2004 | Sekine .......................... | 257/774 |
| 2006/0028508 A1 * | 2/2006 | Chen et al. ..................... | 347/47 |
| 2006/0113582 A1 * | 6/2006 | Ohuchi ......................... | 257/309 |
| 2007/0210365 A1 * | 9/2007 | Togashi et al. ................ | 257/296 |
| 2009/0184089 A1 * | 7/2009 | Chebi et al. ..................... | 216/13 |
| 2009/0302430 A1 * | 12/2009 | Takahashi et al. ............ | 257/621 |
| 2010/0065949 A1 * | 3/2010 | Thies et al. .................... | 257/621 |

FOREIGN PATENT DOCUMENTS

| | | |
|---|---|---|
| JP | 2007-173634 | 7/2007 |
| JP | 2007-311584 | 11/2007 |
| KR | 2003-0000571 | 1/2003 |

* cited by examiner

*Primary Examiner* — Michelle Mandala
(74) *Attorney, Agent, or Firm* — Stanzione & Kim, LLP

(57) ABSTRACT

A semiconductor chip, a method of fabricating the same, and a stack module and a memory card including the semiconductor chip include a first surface and a second surface facing the first surface is provided. At least one via hole including a first portion extending in a direction from the first surface of the substrate to the second surface of the substrate and a second portion that is connected to the first portion and has a tapered shape. At least one via electrode filling the at least one via hole is provided.

28 Claims, 15 Drawing Sheets

SEMICONDUCTOR CHIP, METHOD OF FABRICATING THE SAME, AND STACK MODULE AND MEMORY CARD INCLUDING THE SAME

CROSS-REFERENCE TO RELATED APPLICATIONS

This application claims priority under 35 USC §119 from Korean Patent Application No. 10-2009-0058315, filed on Jun. 29, 2009, in the Korean Intellectual Property Office, the disclosure of which is incorporated herein in its entirety by reference.

BACKGROUND

1. Field of the General Inventive Concept

The present general inventive concept relates to a semiconductor device, and more particularly, to a semiconductor chip, a method of fabricating the same, a stack module including the semiconductor chip, a memory card including the semiconductor chip, and an electronic system including the semiconductor chip.

2. Description of the Related Art

As the demand for semiconductor chips having high integration is increased, the manufacturing costs of semiconductor chips have been significantly increased. Thus, it is difficult to increase the capacity of an individual semiconductor chip. However, the increase of capacity may be achieved via stack modules formed by stacking semiconductor chips. In stack modules, semiconductor chips may be connected using via electrodes.

SUMMARY

The present general inventive concept provides a semiconductor chip, a method of fabricating the same, and a stack module and a memory card including the semiconductor chip. The semiconductor chip may include at least one via hole including a first portion extending in a direction from the first surface of the substrate to the second surface of the substrate and a second portion that is connected to the first portion and has a tapered shape. At least one via electrode filling the at least one via hole may also be provided.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a semiconductor chip including a substrate including a first surface and a second surface facing the first surface, at least one via hole including a first portion extending in a direction from the first surface of the substrate to the second surface of the substrate and a second portion that is connected to the first portion and has a tapered shape, and at least one via electrode to fill the at least one via hole.

The at least one via hole may extend perpendicularly to the first and second surfaces of the substrate. Furthermore, the first portion of the at least one via hole may have an inner surface having a scallop shape.

The at least one via electrode may include a first filling portion and a second filling portion respectively to correspond to the first portion and second portion of the at least one via hole, and the second filling portion has a periphery having a scallop shape.

The at least one via electrode may further include a protrusion portion connected to the first filling portion on the substrate. The protrusion portion may protrude atop the first surface of the substrate.

The semiconductor chip may further include an insulating layer on the first surface of the substrate, wherein the at least one via hole may further a third portion that is connected to the first portion and extends through the insulating layer. Furthermore, the second and third portions of the at least one via hole may have smooth inner surfaces, and the first portion may have an inner surface having a scallop shape.

The semiconductor chip may further include at least one electrode pad on the insulating layer, wherein the at least one via electrode extends through the at least one electrode pad. The at least one via electrode may contacts a top surface of the at least one electrode pad.

A spacer insulating layer may be positioned between the substrate and the at least one via electrode.

The at least one via electrode may perpendicularly pass through the substrate.

The at least one via electrode may protrude from the second surface of the substrate.

The foregoing and/or other aspects and utilities of the present general inventive concept may also be achieved by providing a stack module including a plurality of stacked semiconductor chips, wherein each of the semiconductor chips may include a substrate comprising a first surface and a second surface facing the first surface, at least one via hole comprising a first portion extending in a direction from the first surface of the substrate to the second surface of the substrate and a second portion that is connected to the first portion and has a tapered shape, and at least one via electrode filling the at least one via hole, and the at least one via electrode of each of the semiconductor chips is connected to the at least one via electrode of an adjacent semiconductor chip.

Each of the semiconductor chips may further include at least one electrode pad disposed on the first surface of the substrate, and the at least one via electrode may extend through the at least one electrode pad.

Each of the semiconductor chips may further include a bump layer disposed on the at least one via electrode, and the at least one via electrode of each of the semiconductor chips may extend through the bump layer of an adjacent semiconductor chip under the semiconductor chip.

The foregoing and/or other aspects and utilities of the present general inventive concept may also be achieved by providing a card apparatus including a housing, a memory unit in the housing, and a controller unit in the housing to be configured to control the memory unit, wherein the memory unit may include a substrate include a first surface and a second surface facing the first surface; at least one via hole comprising a first portion extending in a direction from the first surface of the substrate to the second surface of the substrate and a second portion that is connected to the first portion and has a tapered shape, becoming thinner away from the first portion; and at least one via electrode filling the at least one via hole.

The foregoing and/or other aspects and utilities of the present general inventive concept may also be achieved by forming at least one via hole extending in a direction from a first surface of a substrate to a second surface of the substrate, and forming at least one via electrode filling the at least one via hole, wherein the forming of the at least one via hole may include forming a first portion extending from the first surface of the substrate into the substrate, and forming a second portion that extends from the first portion toward the second surface of the substrate and has a tapered shape.

The first portion may be formed substantially perpendicularly to the first surface of the substrate by using a Bosch process, wherein the Bosch process is performed by repeating deposition and etching. Furthermore, the first portion of the at least one via hole may have an inner surface having a scallop shape.

Before the second portion of the at least one via hole is formed, a first passivation layer may be further formed on an inner surface of the first portion. Furthermore, before the second portion of the at least one via hole is formed, a second passivation layer may be further formed on the first passivation layer. Each of the first passivation layer and the second passivation layer may include a polymer layer.

The method may further include forming at least one electrode pad on the first surface of the substrate, wherein the at least one via hole further comprises a third portion connected to the first portion and passes through the at least one electrode pad.

Before the at least one via electrode is formed, the method may further include forming a spacer insulating layer on a surface of the substrate inside the at least one via hole.

The method may further include exposing an end of the at least one via electrode by the second surface of the substrate.

The foregoing and/or other aspects and utilities of the present general inventive concept may also be achieved by providing a semiconductor chip including a substrate having a main body defined by a first surface and a second surface, and a via hole formed in the main body and having a width variable along a direction from the first surface to the second surface.

The semiconductor chip may also include a via electrode to fill the via hole. The semiconductor chip may also include an integrated circuit formed on the main body and connected to the via electrode.

The via hole may further include first wall portions adjacent to the first surface that include a plurality of connected convex indentations. The via hole may further include second wall portions having a flat surface, the second wall portions disposed closer to the second surface than the first surface.

The via hole may pass through both the first surface and the second surface and may include a filling to fill the via hole and protrude from both surfaces.

The via hole may also include a first portion formed adjacent to the first surface of the substrate, the first portion having a first width that is narrower towards the first surface than the second surface, and a second portion disposed closer to the second surface than the first portion, the second portion having a second width that is narrower toward the second surface than the first surface, and the second width being more narrow than the first width.

BRIEF DESCRIPTION OF THE DRAWINGS

The above and/or other features and utilities of the present general inventive concept will become apparent and more readily appreciated from the following description of the exemplary embodiments, taken in conjunction with the accompanying drawings, in which.

DETAILED DESCRIPTION OF THE EMBODIMENTS

Figure 1:
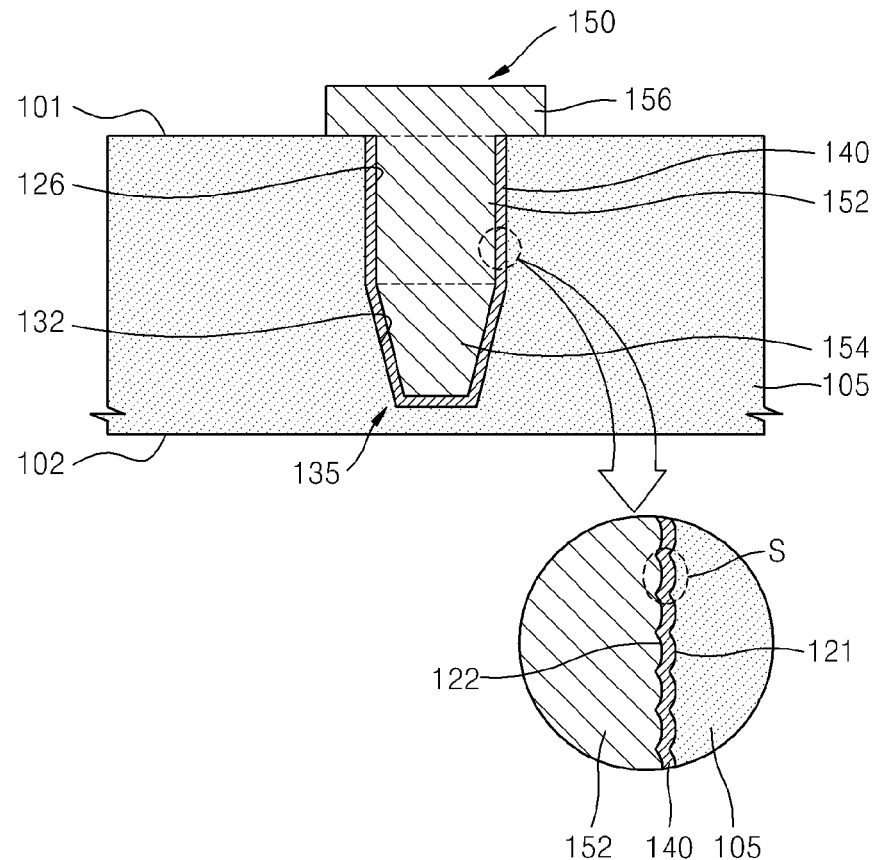
FIG. 1 is a cross-sectional view illustrating a semiconductor chip according to an embodiment of the present general inventive concept.

One or more embodiments of the present general inventive concept will now be described more fully with reference to the accompanying drawings. The present general inventive concept may, however, be embodied in many different forms and should not be construed as being limited to the embodiments set forth herein. Rather, these embodiments are provided so that this disclosure will be thorough and complete, and will fully convey the concept of the present general inventive concept to those skilled in the art. In the drawings, constituent elements are exaggerated for clarity. Like reference numerals refer to like elements throughout.

The terms used in one or more embodiments of the present general inventive concept may have meanings conventionally known to those of ordinary skill in the art, if not defined otherwise. For example, a low-k dielectric layer refers to an insulating layer having a smaller dielectric constant than oxides and nitrides, and a high-k dielectric layer refers to an insulating layer having a larger dielectric constant than oxides and nitrides.

FIG. 1 is a cross-sectional view illustrating a semiconductor chip according to an embodiment of the present general inventive concept.

Referring to FIG. 1, a substrate 105 may include a first surface 101 and a second surface 102, wherein the first and second surfaces 101 and 102 face each other with respect to a main body of the substrate 105. For example, the first surface 101 refers to a top surface and the second surface 102 refers to a bottom surface. The substrate 105 can include an integrated circuit (not illustrated) therein. In other embodiments, the integrated circuit may be disposed on the first surface of the substrate 105. That is, the first surface 101 of the substrate 105 may be an active surface on which an active device is formed as the integrated circuit connected through a conductive line. The integrated circuit may vary according to the type of the semiconductor chip. For example, the integrated circuit may include a memory circuit, logic circuit, or a combination thereof. The substrate 105 may include a semiconductor wafer (not illustrated), and may further include an integrated circuit disposed on the semiconductor wafer. The semiconductor wafer may include Si, SiGe, a Group IV material or a Group III-V compound material.

At least one via electrode 150 may be disposed to fill at least one via hole 135 and overlap a top of the first surface 101 of the substrate 105. The via hole 135 may include a first portion 126 and a second portion 132. The first portion 126 may extend in a direction from the first surface of the substrate 105 to the second surface of the substrate 105, that is, may extend into the main body of the substrate 105. The second portion 132 may be connected to the first portion 126 and may have a tapered shape, becoming thinner toward the second surface of the substrate 105. The via hole 135 may extend substantially perpendicular with respect to the first and second surfaces of the substrate 105. The first portion 126 may have an inner surface having a scallop, or rugged shape S, and the second portion 132 may have a smooth surface that does not have the scallop shape S. The scallop shape S may be characterized by a plurality of extended and connected convex and concave portions, a plurality of convex portions connected to each other in series, or a plurality of concave portions connected in series.

The via electrode 150 may extend from the first surface of the substrate 105 into the substrate 105. The via electrode 150 may be connected to an integrated circuit disposed inside a corresponding semiconductor chip, may connect the corresponding semiconductor chip to another semiconductor chip, and may connect the corresponding semiconductor chip to a module substrate.

For example, the via electrode 150 may include a first filling portion 152, second filling portion 154, and/or a protrusion portion 156. The first filling portion 152 may fill the first portion 126, and the second filling portion 154 may fill the second portion 132. The protrusion portion 156 may be connected to the first filling portion 152 and disposed on the first surface of the substrate 105. The first filling portion 152, second filling portion 154 and protrusion portion 156 may be filled with conductive metals as are known in the art such as copper, gold, aluminum, combinations and alloys thereof.

The first filling portion 152 may extend from the first surface of the substrate 105 into the substrate 105 and the longer sides of the first filling portion 152 are substantially perpendicular to the first 101 and second 102 surfaces of the substrate 105. The second filling portion 154 may extend continuously from the first filling portion 152 toward the second surface of the substrate 105. For example, the second filling portion 154 may become thinner toward the second surface of the substrate 105, that is, may have a tapered shape.

The protrusion portion 156 may re-interconnect the via electrode 150 on the first surface 101 of the substrate 105.

The first filling portion 152 may have a periphery having the scallop shape S. That is, macroscopically, the first filling portion 152 may have a cylindrical shape substantially perpendicular to the first and second surfaces of the substrate 105, but microscopically, the periphery of the first filling portion 152 may have the scallop shape S, which is similar to a wave shape. Thus, macroscopically, the first filling portion 152 may have a cylindrical shape having a selected pattern. For example, the first filling portion 152 and the second filling portion 154 may have a cylindrical shape or a polyangular pillar shape.

As illustrated in the enlarged portion of FIG. 1, the scallop shape of the first portion 126 can result in the spacer insulating layer 140 having concave portions 121 that border the substrate 105. Likewise, the scallop shape of the first portion 126 can cause the spacer insulating layer 140 to have convex portions 122 that border the first filling portion 152. As a result, the portions of the substrate 105 that border the first portion 126 can have multiple connected convex portions and the first filling portion 152 that borders the first portion 126 can have multiple connected concave portions.

A periphery of the second filling portion 154 may not substantially have the scallop shape S. The periphery of the second filling portion 154 may have a substantially smooth shape. For example, the second filling portion 154 may have a truncated pillar shape, becoming thinner toward the second surface of the substrate 105.

A spacer insulating layer 140 may be disposed between the via electrode 150 and the substrate 105. For example, the spacer insulating layer 140 may be disposed between the first filling portion 152 and the substrate 105 and between the second filling portion 154 and the substrate 105.

The spacer insulating layer also extends parallel to the bottom surface 102 of the substrate 105. The spacer insulating layer 140 may be made of SiO, SiN, SiON, or higher dielectric constant insulating layers. Since the spacer insulating layer 140 is formed between a metal layer and a semiconductor layer, the via electrode may have different capacitive properties, depending on the materials selected for the substrate 105, spacer insulating layer 140 and filling portions 152 and 154.

According to the present embodiment, since the second filling portion 154 having a tapered shape is disposed in a lower part of the via electrode 150, the via electrode 150 may be formed substantially without forming voids. The lack of voids may also be attributed to the smooth surface along the sides of the second portion 132 of the via hole. Another property or result of the configuration of the via hole 135 and via electrode 150 is that since the first filling portion 152 has a substantially constant width, increase in the electric resistance of the via electrode 150 may be hindered. Thus, the height ratio of the first filling portion 152 to the second filling portion 154 may be appropriately selected in consideration of void formation and electric resistance. Meanwhile, the inclination angle of the second filling portion 154 may be determined in consideration of, in addition to the void formation, penetration availability of an adhesive layer to be used when forming a stack module.

Meanwhile, in other embodiments, the scallop shape S of the second portion 132 may be sufficiently small that a periphery of the spacer insulating layer 140 may have a smooth surface. In these cases, the first filling portion 152 may not have the scallop shape S.

Figure 2:
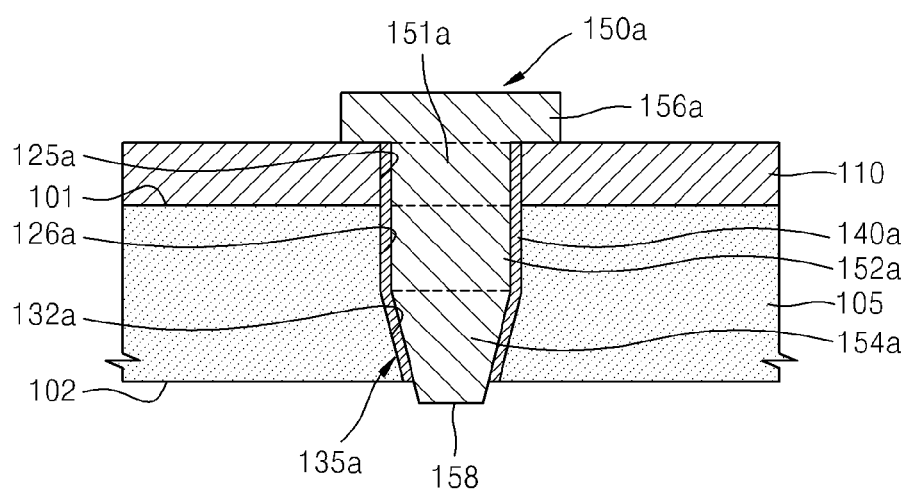
FIG. 2 is a cross-sectional view illustrating a semiconductor chip according to another embodiment of the present general inventive concept.

FIG. 2 is a cross-sectional view illustrating a semiconductor chip according to another embodiment of the present general inventive concept. The semiconductor chip according to the present embodiment may be similar to the semiconductor chip that has been described with reference to FIG. 1. Thus, the same description will be omitted herein.

Referring to FIG. 2, an insulating layer 110 may be further disposed on the substrate 105. For example, the substrate 105 may be a semiconductor wafer, and an integrated circuit may be disposed on the substrate 105. The insulating layer 110 may include a passivation layer to protect the integrated circuit, or interlayer insulating layers between multi-layered interconnecting lines of the integrated circuit. The insulating layer 110 may include SiO, SiN, and other insulating layer materials known in the art.

A via hole 135a may include a third portion 125a in addition to a first portion 126a and a second portion 132a. The third portion 125a may be connected to the first portion 126a, and may pass through the insulating layer 110.

A via electrode 150a may further include a third filling portion 151a in addition to a first filling portion 152a and a second filling portion 154a. The first filling portion 152a may extend from the first surface 101 of the substrate 105 into the substrate 105. The second filling portion 154a may extend from the first filling portion 152a to the second surface 102 of the substrate 105. For example, the second filling portion 154a may include a second protrusion 158 that protrudes from a spacer insulation layer 140a the second surface of the substrate 105. The third filling portion 151a may be connected to the first filling portion 152a, may overlap the insulating layer 110, and may fill the third portion 125a. A protrusion portion 156a may extend from the third filling portion 151a onto the insulating layer 110. A portion of the spacer insulating layer 140a may be removed to expose the second protrusion 158.

Figure 3:
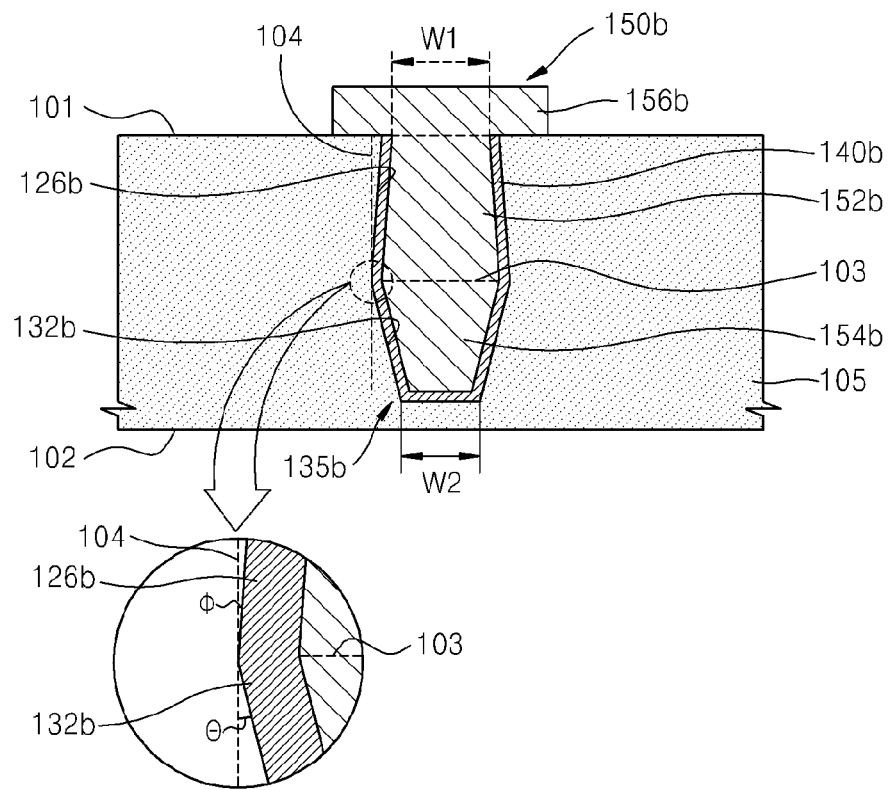
FIG. 3 is a cross-sectional view illustrating a semiconductor chip according to another embodiment of the present general inventive concept.

FIG. 3 is a cross-sectional view illustrating a semiconductor chip according to another embodiment of the present general inventive concept. The semiconductor chip according to the present embodiment is similar to the semiconductor chips that have been described with reference to FIGS. 1 and 2. Thus, the same description will be omitted herein.

Referring to FIG. 3, a via hole 135b may include a first portion 126b and a second portion 132b. Unlike the first portion 126 of FIG. 1, the first portion 126b may have a negative inclination angle with respect to a vertical line 104, which can be identified as a reference axis. Thus, the via hole 135b has an intermediate portion near a horizontal line 103 that is wider than end portions disposed near the first surface 101 and the second surface 102 of the substrate 105. That is, the width of the first portion 126b of the via hole 135b gradually increases from the first surface 101 of the substrate 105 toward the intermediate portion near the horizontal line 103 and the width of the second portion 132b gradually decreases from the intermediate portion toward the second surface 102 of the substrate 105.

A via electrode 150b may include a first filling portion 152b, a second filling portion 154b, and a protrusion portion 156b. A spacer insulating layer 140b may be disposed between the first filling portion 152b and the substrate 105 and between the second filling portion 154b and the substrate 105. The width of the first filling portion 152b may increase from the first surface of the substrate 105 to the intermediate portion and the width of the second filling portion 154b decreases toward the second surface of the substrate 105. To prevent formation of voids, the inclination angle $\phi$ of the first filling portion 152b is within $-10°$, or within $-5°$ with respect to the vertical line 104.

The inclination angle $\phi$ is drawn between the vertical line 104 and a side of the first portion 126b of the via hole as illustrated in the first magnified portion of FIG. 3. A second magnified portion illustrates a second inclination angle $\theta$ representing the angle between the vertical line 104 and the second portion 132b of the via hole. As illustrated in FIG. 3, the angle $\theta$ may be larger than the angle $\phi$. However, in other embodiments, the angle $\theta$ may be smaller than the angle $\phi$, thus resulting in via holes of various shapes, depending on desired connectivity of the via electrode 150 to other devices as well as regarding different stacking configurations of multiple substrates.

As illustrated in FIG. 3, the via hole 135b may include the first portion 126b formed adjacent the first surface 101 of the substrate, the first portion 126b may have a first width $W_1$ adjacent the first surface 101 that is narrower towards the first surface 101 than toward the second surface 102. The second portion 132b of the via hole 135b which is disposed closer to the second surface 102 than the first portion 126b may have a second width $W_2$ narrower towards the second surface 102 than to the first surface 101. As illustrated in FIG. 3, $W_2$ may be smaller, or shorter than $W_1$. However, in other embodiments of the present general inventive concept, $W_2$ may be larger, or longer than $W_1$.

Figure 4:
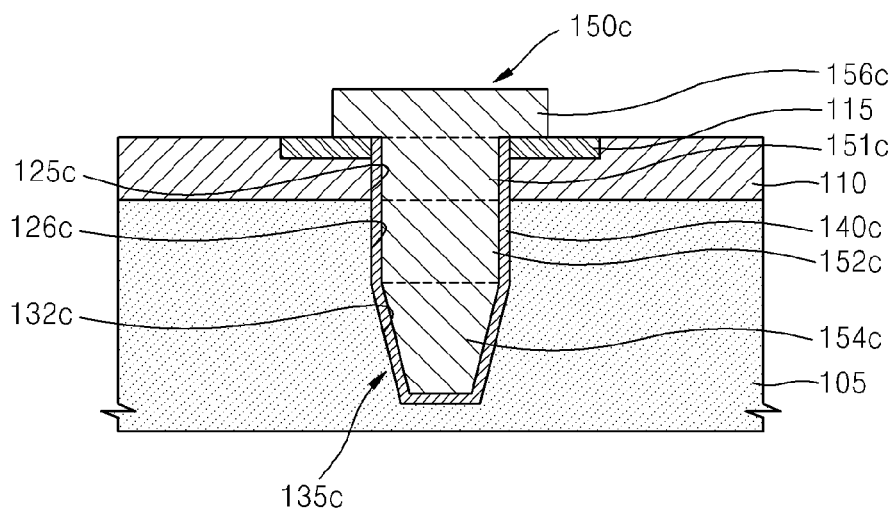
FIG. 4 is a cross-sectional view illustrating a semiconductor chip according to another embodiment of the present general inventive concept.

FIG. 4 is a cross-sectional view illustrating a semiconductor chip according to another embodiment of the present general inventive concept. The semiconductor chip according to the present embodiment is similar to the semiconductor chips that have been described with reference to FIGS. 1 through 3. Thus, the same description will be omitted herein.

Referring to FIG. 4, the insulating layer 110 may be disposed on the substrate 105, and at least one electrode pad 115 may be disposed on the insulating layer 110. The electrode pad 115 may be electrically connected to an integrated circuit of a semiconductor chip. The electrode pad 115 may be disposed in a Damascene pattern or an embossing pattern on the insulating layer 110.

A via hole 135c may include a first portion 126c, a second portion 132c, and a third portion 125c. The first portion 126c and second portion 132c may be understood by referring to the first portion 126 and second portion 132 of FIG. 1. The third portion 125c may be directly connected to the first portion 126c, and may pass through the electrode pad 115 and the insulating layer 110.

A via electrode 150c may pass through the electrode pad 115, and may be electrically connected to the electrode pad 115. For example, the via electrode 150c may include a first filling portion 152c, a second filling portion 154c, a third filling portion 151c, and a protrusion portion 156c. The first and second filling portions 152c and 154c may be understood by referring to the first and second filling portions 152 and 154 of FIG. 1. The third filling portion 151c may fill the third portion 125c. For example, the third filling portion 151c may be connected to the first filling portion 152c, and may pass through the insulating layer 110 and the electrode pad 115.

The protrusion portion 156c may be disposed on the electrode pad 115 and connected to the third filling portion 151c. For example, a bottom surface of the protrusion portion 156c may contact the electrode pad 115 and the third filling portion 151c. A spacer insulating layer 140c may be disposed on an inner surface of the via hole 135c. An upper surface of the electrode pad 115 may be co-planar with an upper surface of the insulating layer 110 and a bottom surface of a protrusion portion 156c.

Figure 5:
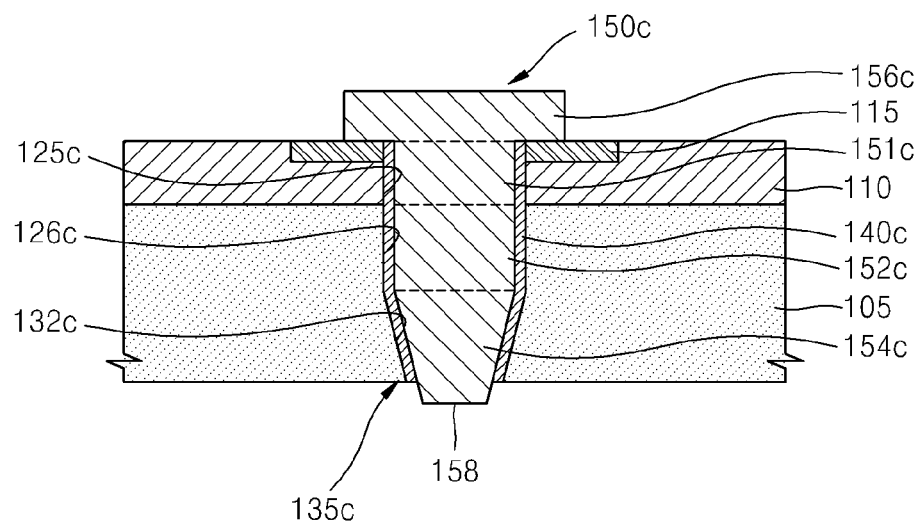
FIG. 5 is a cross-sectional view illustrating a semiconductor chip according to another embodiment of the present general inventive concept.

FIG. 5 is a cross-sectional view illustrating a semiconductor chip according to another embodiment of the present general inventive concept. The semiconductor chip according to the present embodiment is similar to the semiconductor chip that has been described with reference to FIG. 4. Thus, the same description will be omitted herein.

Referring to FIG. 5, the via electrode 150c may extend through the substrate 105 extending past the first surface 101 and the second surface 102 of the substrate 105 on both sides of the substrate. For example, the second filling portion 154c may protrude from the second surface 102 of the substrate 105 and include a second protrusion 158 that is not covered by the spacer insulating layer 140c. Thus, the via electrode 150c may transmit a signal of an integrated circuit disposed on the first surface 101 of the substrate 105 to the second surface 102 of the substrate 105. Thus, the via electrode 150c may be used to transmit a signal of the semiconductor chip in a direction perpendicular to the first and second surfaces of the substrate 105, which will be described later.

Figure 6:
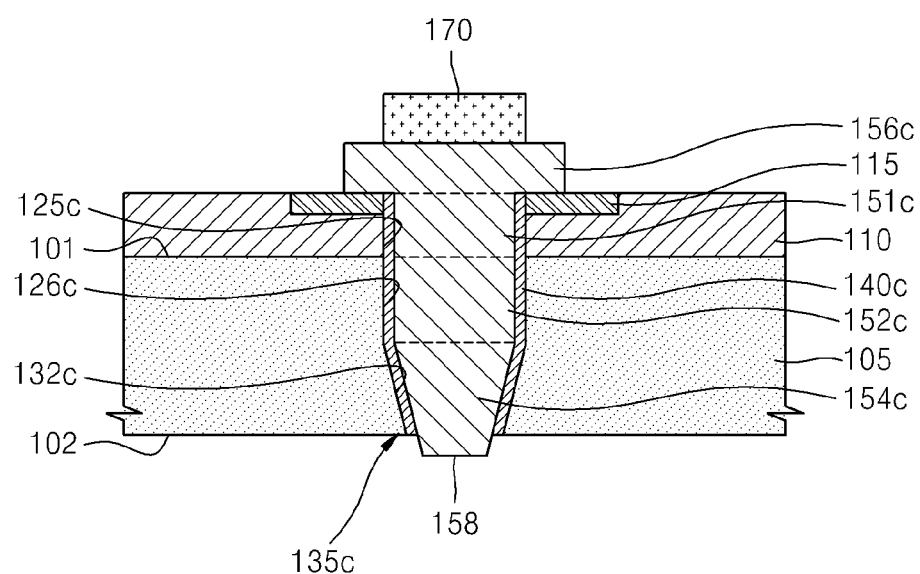
FIG. 6 is a cross-sectional view illustrating a semiconductor chip according to another embodiment of the present general inventive concept.

FIG. 6 is a cross-sectional view illustrating a semiconductor chip according to another embodiment of the present general inventive concept. The semiconductor chip according to the present embodiment is similar to the semiconductor chip that has been described with reference to FIG. 5. Thus, the same description will be omitted herein.

Referring to FIG. 6, a bump layer 170 may be disposed on the protrusion portion 156c. For example, the bump layer 170 may include a conductive solder. The bump layer 170 may be used to form a stack module including a plurality of semiconductor chips, which will be described later.

Figure 7:
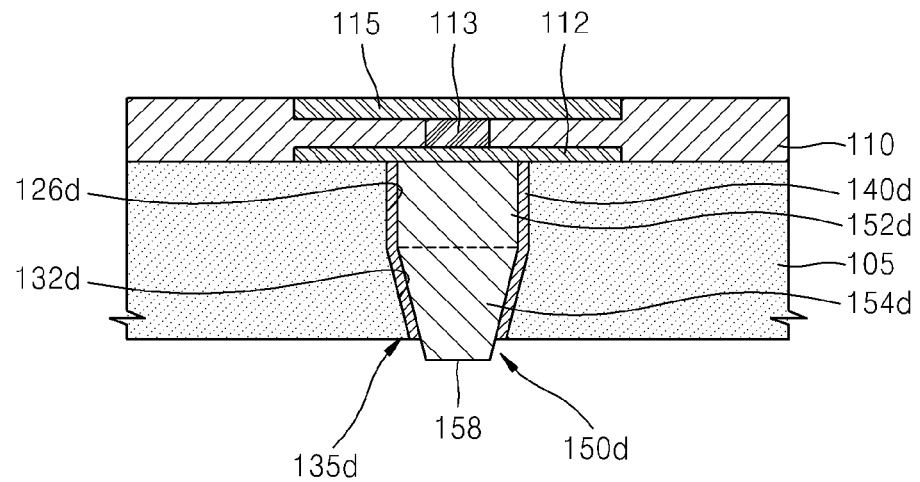
FIG. 7 is a cross-sectional view illustrating a semiconductor chip according to another embodiment of the present general inventive concept.

FIG. 7 is a cross-sectional view illustrating a semiconductor chip according to another embodiment of the present general inventive concept. The semiconductor chip according to the present embodiment is similar to the semiconductor chips that have been described with reference to FIGS. 1 through 6. Thus, the same description will be omitted herein.

Referring to FIG. 7, a via hole 135d may perpendicularly pass through the first 101 and the second 102 surfaces of the substrate 105. For example, the via hole 135d may include a first portion 126d and a second portion 132d. The first portion 126d and the second portion 132d may be understood by referring to the first portion 126a and second portion 132a of FIG. 2. A spacer insulating layer 140d may be disposed on an inner surface of the via hole 135d.

A via electrode 150d may fill the via hole 135d and protrude from the second surface 102 of the substrate 105. For example, the via electrode 150d may include a first filling portion 152d and a second filling portion 154d. The first filling portion 152d and the second filling portion 154d may be understood by referring to the first filling portion 152a and second filling portion 154a of FIG. 2.

At least one interconnection layer 112 and at least one contact plug 113 may be disposed in the insulating layer 110. The interconnection layer 112 may be electrically connected to the electrode pad 115 through the contact plug 113. The interconnection layer 112 may be disposed on the substrate 105 and is connected to the via electrode 150d. Thus, the electrode pad 115 may be connected to the via electrode 150d through the contact plug 113 and the interconnection layer 112. The electrode pad 115 and interconnection layers may be formed of metal layers known to those skilled in the art, such as aluminum, copper, and alloys thereof. The contact plug may be formed of similar materials, as well as tungsten, titanium, and alloys thereof.

Figure 8:
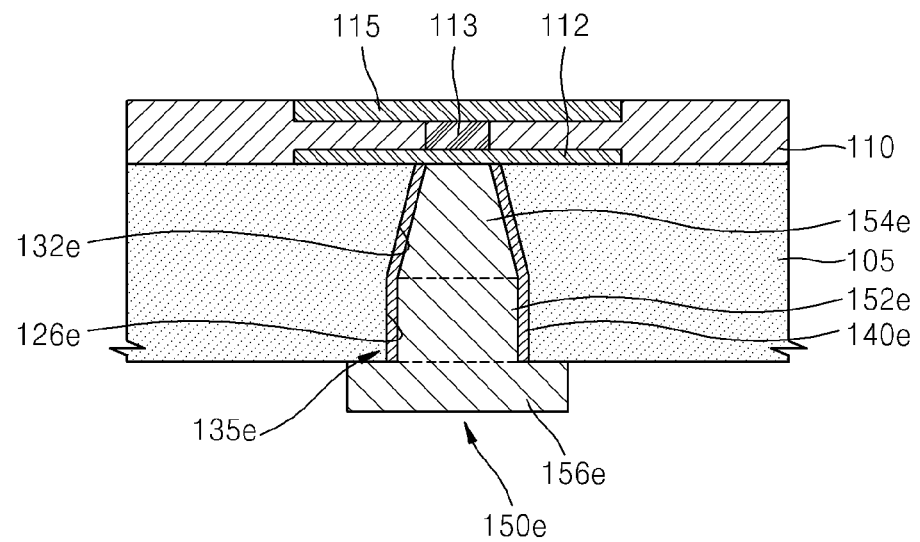
FIG. 8 is a cross-sectional view illustrating a semiconductor chip according to another embodiment of the present general inventive concept.

FIG. 8 is a cross-sectional view illustrating a semiconductor chip according to another embodiment of the present general concept. The semiconductor chip according to the present embodiment is similar to the semiconductor chips that have been described with reference to FIGS. 1 through 7. Thus, the same description will be omitted herein.

Referring to FIG. 8, a via hole 135e may include a first portion 126e and a second portion 132e. The via hole 135e may correspond to an upside-down reflection of the via hole 135d of FIG. 7. Thus, the first portion 126e may extend from the second surface 102 of the substrate 105 into the substrate 105, and the second portion 132e may extend from the first portion 126e to the first surface of the substrate 105. A spacer insulating layer 140e may be disposed on an inner surface of the via hole 135e.

The via electrode 150e may include a first filling portion 152e, a second filling portion 154e, and a protrusion portion 156e. The first filling portion 152e may extend from the second surface of the substrate 105 into the substrate 105, and the second filling portion 154e may extend from the first filling portion 152e to the first surface of the substrate 105. The second filling portion 154e may be connected to the interconnection layer 112 disposed on the first surface of the substrate 105. The protrusion portion 156e may be connected to the first filling portion 152e, and disposed on the second surface of the substrate 105.

Figure 9:
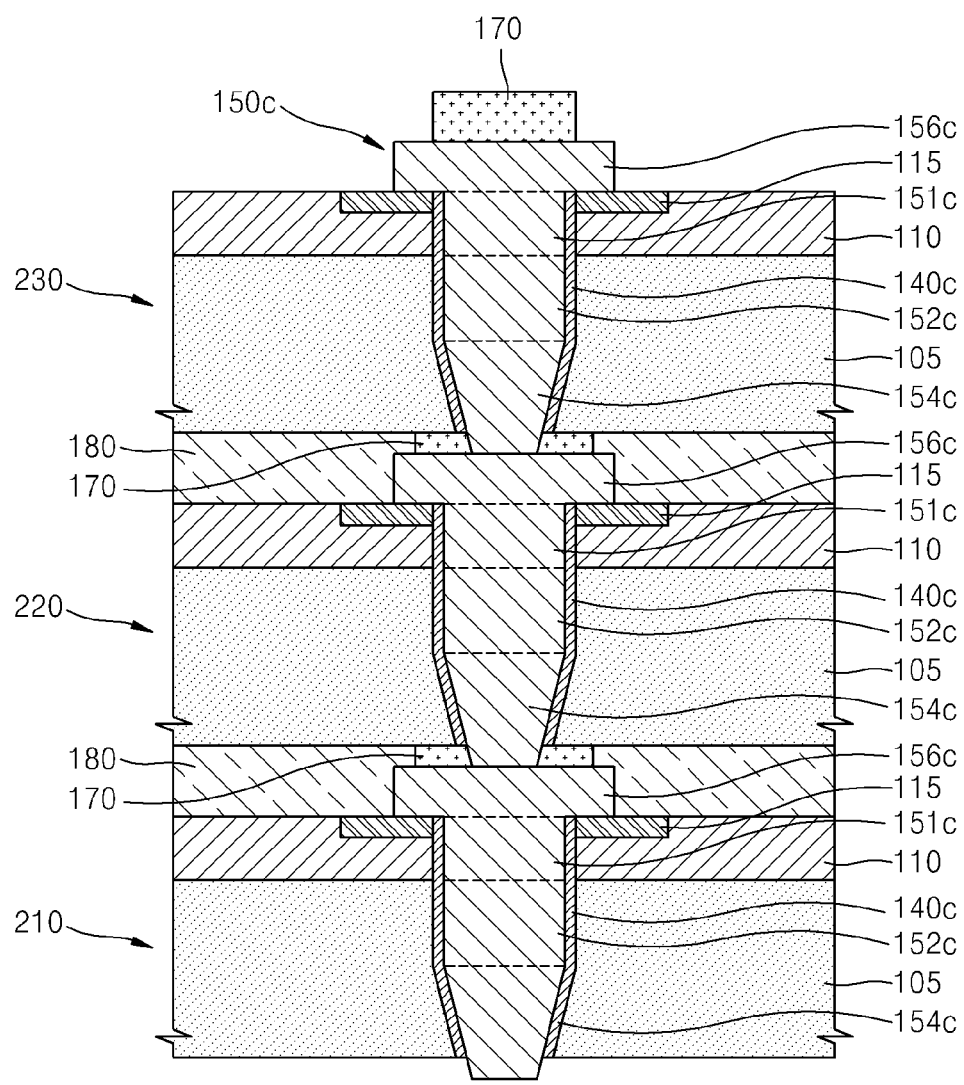
FIG. 9 is a cross-sectional view illustrating a stack module according to an embodiment of the present general inventive concept.

FIG. 9 is a cross-sectional view illustrating a stack module according to an embodiment of the present general inventive concept.

Referring to FIG. 9, a plurality of semiconductor chips 210, 220, and 230 may be stacked. Exemplarily, each of the semiconductor chips 210, 220, and 230 has the same structure as the semiconductor chip of FIG. 6. However, each of the semiconductor chips 210, 220, and 230 may also have the same structure as any of the semiconductor chips that have been described above. The number of semiconductor chips is exemplary and is not limited to the present embodiment.

The semiconductor chips 210, 220, and 230 may be electrically connected to each other through via electrodes 150c. Also, the semiconductor chips 210, 220, and 230 may be attached to each other by interposing adhesive layers 180 therebetween. In the present embodiment, the semiconductor chip 220 is stacked on the semiconductor chip 210, and the semiconductor chip 230 is stacked on the semiconductor chip 220. For example, a second filling portion 154c of the semiconductor chip 230 may be connected around the periphery of the second filling portion 154c to a bump layer 170 of the semiconductor chip 220. In order to improve the connection, the second filling portion 154c of the semiconductor chip 230 may pass through the bump layer 170 of the semiconductor chip 220 and contact a protrusion portion 156c of the semiconductor chip 220. Likewise, a second filling portion 154c of the semiconductor chip 220 may pass through a bump layer 170 of the semiconductor chip 210 and contact a protrusion portion 156c of the semiconductor chip 210.

Thus, the adhesive layer 180 that connects the semiconductor chips 220 and 230 is in contact with the insulating layer 110, the electrode pad 115, the protrusion portion 156c, the bump layer 170 and the substrate 105 of the semiconductor chip 230.

Due to the tapered shape of the second filling portions 154c, the via electrode 150c of the semiconductor chip 230 may be more easily inserted into the adhesive layer and the bump layer 170 of the semiconductor chip 220. Likewise, the via electrode 150c of the semiconductor chip 220 may be more easily inserted into the adhesive layer and the bump layer 170 of the semiconductor chip 210. Thus, the semiconductor chips 210, 220, and 230 may be more strongly connected to each other. Thus, the connection reliability of the stack module may be improved.

Meanwhile the stack module as described above may be mounted on a module substrate (not illustrated).

FIGS. 10 through 16 are cross-sectional views illustrating a method of fabricating a semiconductor chip according to an embodiment of the present general inventive concept.

Figure 10:
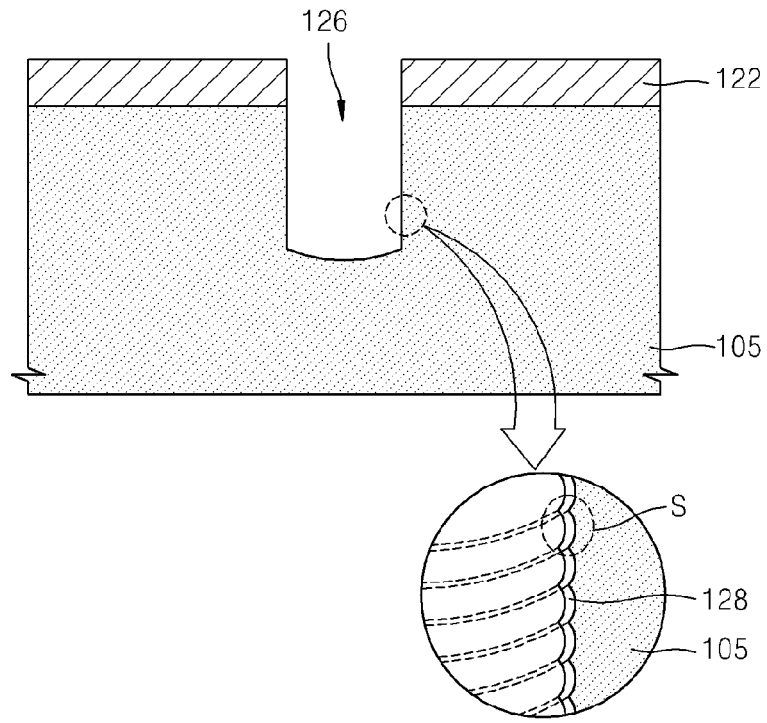
FIGS. 10 through 16 are cross-sectional views illustrating a method of fabricating a semiconductor chip according to an embodiment of the present general inventive concept.

Referring to FIG. 10, a mask layer 122 is formed on a substrate 105, and subsequently, the substrate 105 is etched using the mask layer 122 as a protection layer to form a first portion 126 of a via hole (see 135 of FIG. 12). For example, the mask layer 122 may include a photoresist pattern.

For example, the first portion 126 may be formed substantially perpendicularly to the substrate 105 by using a Bosch process. Macroscopically, the first portion 126 may have a constant width and extend vertically. However, microscopically, the first portion 126 may have a periphery having a scallop shape S. Also, a first passivation layer 128 may be formed on the surface of the first portion 126.

In the present embodiment, the Bosch process may refer to an etching process to form a vertical profile by repeatedly performing deposition and etching. For example, as illustrated in the enlarged view of FIG. 10, the scallop pattern S, which has a wave shape, may be formed by repeatedly performing etching, and depositing of the first passivation layer 128.

For example, if the substrate 105 includes silicon, in the Bosch process, the etching may be performed using $SF_6$ gas for silicon etching, and the deposition of the first passivation layer 128 may be performed using $C_4F_8$ gas to deposit carbon polymer. In this case, etching time may be longer than deposition time so that the etching is sufficiently performed.

The first passivation layer 128 may include a polymer layer. During the etching, a portion of the first passivation layer 128 on a bottom surface of the first portion 126 may be removed and a portion of the first passivation layer 128 on side walls of the first portion 126 may remain. However, according to etching conditions, the first passivation layer 128 may not remain on the side walls of the first portion 126 or may be uniformly formed.

The etching condition of the Bosch process is exemplary and is not limited to the present embodiment. The etching condition of the Bosch process may vary according to the type of the substrate 105 and the size of the first portion 126. The etching condition of the Bosch process may be selected such that the first portion 126 has a vertical profile.

Figure 11:
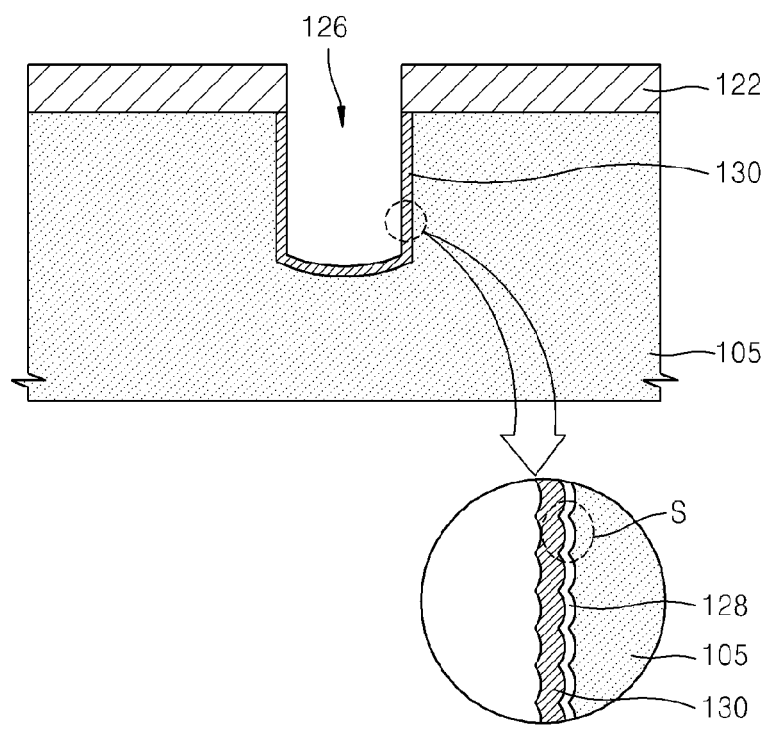

Referring to FIG. 11, a second passivation layer 130 may be formed on an inner surface of the first portion 126. The second passivation layer 130 prevents the first portion 126 from being further widened when a second portion is formed later. The second passivation layer 130 may be much thicker than the first passivation layer 128. For example, the thickness of the second passivation layer 130 may be 50 to 100 times greater than that of the first passivation layer 128. The second passivation layer 130 may include a polymer layer.

Meanwhile, if the first passivation layer 128 uniformly remains on the side walls of the first portion 126, the second passivation layer 130 may not be formed.

Figure 12:
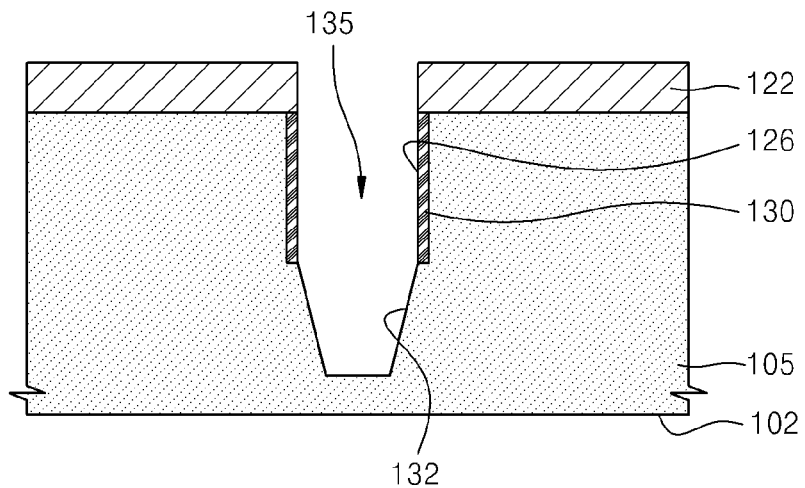

Referring to FIG. 12, a portion of the substrate 105 under the first portion 126 may be etched using the mask layer 122 as a protection layer, thereby forming a second portion 132. Thus, a via hole 135 including the first portion 126 and the second portion 132 is formed. The second portion 132 may have a tapered shape, becoming thinner away from the first portion 126.

For example, the second portion 132 may be formed by performing a first etching to remove a portion of the second passivation layer 130 on the bottom surface of the first portion 126 and a second etching to etch the substrate 105. The first etching may be performed using an etching gas to remove carbon polymer, for example, a $CHF_3$ gas. In this phase, the second passivation layer 130 on the side walls of the first portion 126 may remain.

The second etching may be performed by using a non-Bosch process. For example, the second etching may be performed using $SF_6$ gas to etch silicon. Furthermore, in the second etching, an $O_2$ gas may be additionally used. In such etching conditions, the width of the second portion 132 decreases closer to the second surface of the substrate 105. During the second etching, the second passivation layer 130 remaining on the side walls of the first portion 126 may prevent the first portion 126 from being further widened.

The second etching using the non-Bosch process may be performed in a shorter amount of time than the first etching using the Bosch process. Thus, by forming the via hole 135 using both the Bosch process and the non-Bosch process, the etching time may be reduced compared to when only the Bosch process is used.

Meanwhile, the aspect ratio of the via hole 135 may be lowered by disposing the second portion 132 having the tapered shape under the first portion 126 having the vertical profile. In addition, the aspect ratio of the via hole 135 may be easily adjusted by controlling the angle of the second portion 132 by controlling the second etching.

Then, the mask layer 122 and the first and second passivation layers 128 and 130 may be removed.

Figure 13:
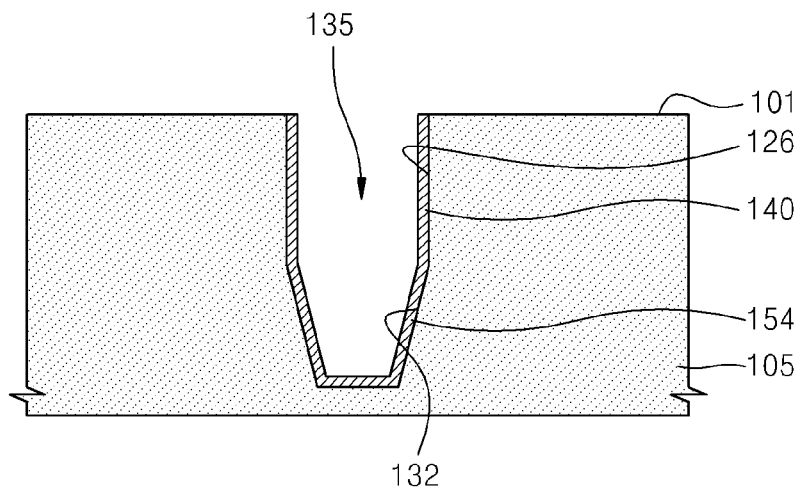

Referring to FIG. 13, a spacer insulating layer 140 may be formed on an inner surface of the via hole 135. For example, the spacer insulating layer 140 may be an appropriate insulating layer, for example, an oxide layer, a nitride layer, a low-k dielectric layer, or a high-k dielectric layer.

Optionally, a portion of a spacer insulating layer 140 on the first surface of the substrate 105 may be removed. For example, via anisotropic etching, the portion of the spacer insulating layer 140 on the first surface of the substrate 105 is removed while not etching a portion the spacer insulating layer 140 inside the via hole 135.

Figure 14:
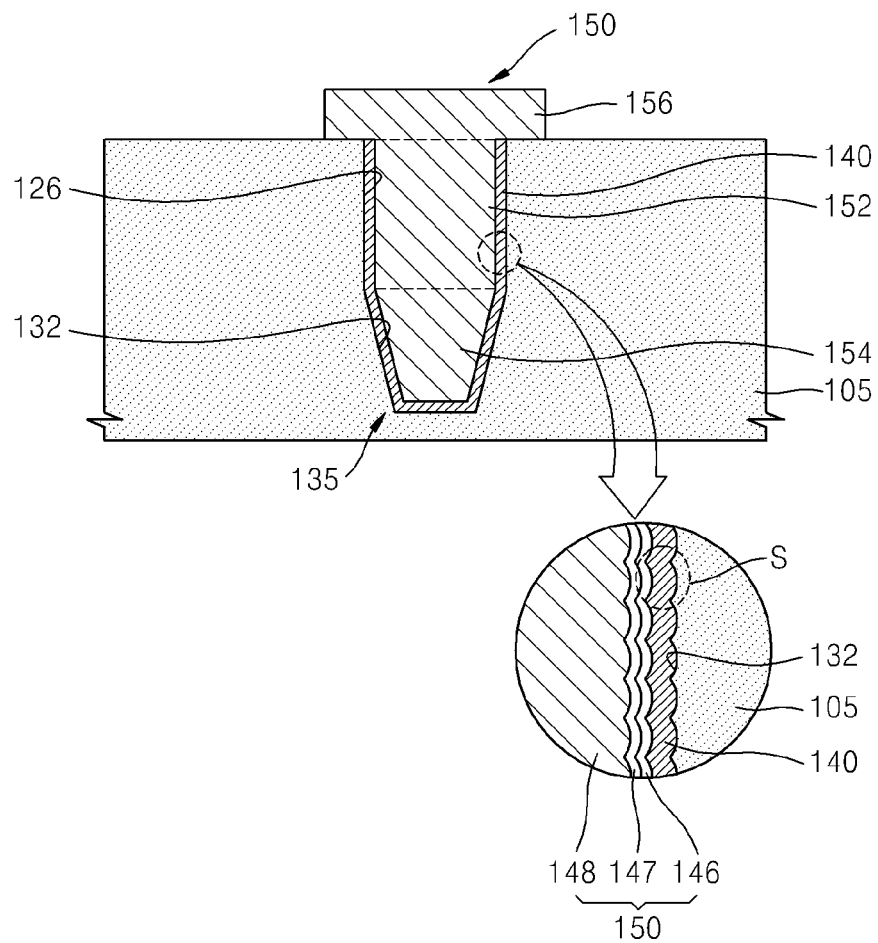

Referring to FIG. 14, a via electrode 150 filling the via hole 135 may be formed on the spacer insulating layer 140. The via electrode 150 may include a first filling portion 152 filling the first portion 126, a second filling portion 154 filling the second portion 132, and a protrusion portion 156 protruding from the substrate 105.

As illustrated in the enlarged view of FIG. 14, the via electrode 150 may include a barrier layer 146 contacting the spacer insulating layer 140, a seed layer 147 on the barrier layer 146, and a filling layer 148 on the seed layer 147. For example, the barrier layer 146 may have a stacked structure including at least one selected from the group consisting of titanium (Ti), tantalum (Ta), titanium nitride (TiN), and tantalum nitride (TaN). The seed layer 147 and the filling layer 148 may include copper (Cu). In this case, the filling layer 148 may be formed by plating.

Meanwhile, the filling layer 148 may include conductive materials other than Cu, for example, tungsten (W), aluminum (Al), or polysilicon. In this case, the seed layer 147 may not be formed. In this case, the filling layer 148 may be formed by physical vapor deposition (PVD) or chemical vapor deposition (CVD).

In the present embodiment, since the filling layer 148 is formed by filling the via hole 135 having a low aspect ratio, excellent edge step coverage is obtained without formation of voids or under-cuts.

Figure 15:
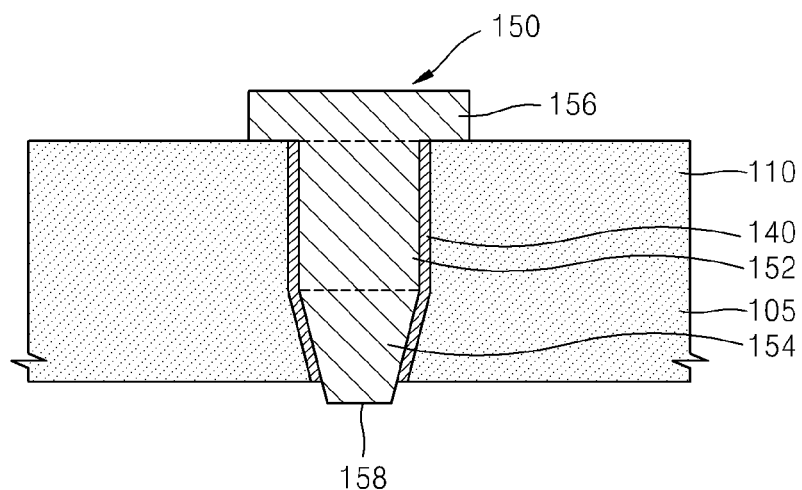

Referring to FIG. 15, a portion of the substrate 105 including the second surface of the substrate 105, for example, a bottom portion of the substrate 105 is removed to expose the second protrusion 158 of the via electrode 150 by the second surface of the substrate 105. For example, the bottom portion of the substrate 105 is removed via planarization, for example, via etch back or chemical mechanical polishing (CMP). In this phase, a bottom portion of the spacer insulating layer 140 may be removed and thus the via electrode 150 passes through the substrate 105.

Then, the bottom portion of the substrate 105 may be further removed so that the bottom portion of the second protrusion 158 protrudes from the bottom portion of the substrate 105. For example, side walls of the second protrusion 158 may be exposed by selectively etching the substrate 105 via anisotropic etching or isotropic etching. In this case, portions of the spacer insulating layer 140 exposed on the side walls of the second protrusion 158 may be removed.

Figure 16:
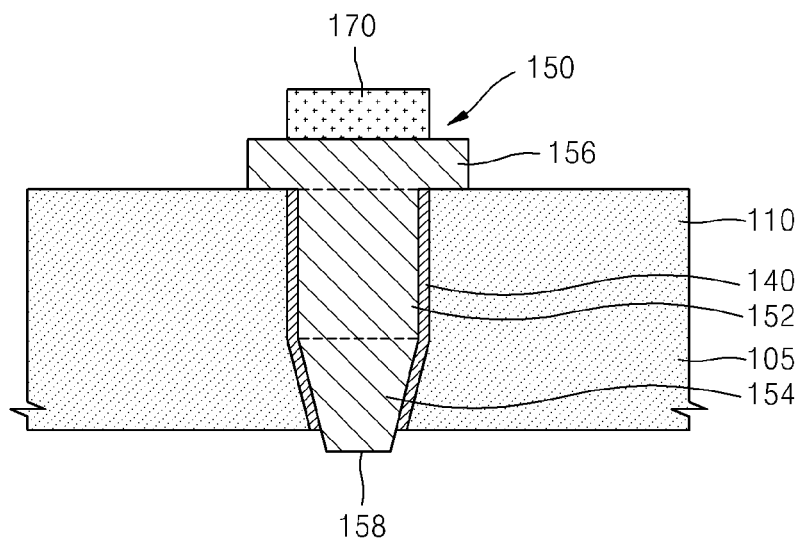

Referring to FIG. 16, selectively, a bump layer 170 may be formed on the via electrode 150.

Figure 17:
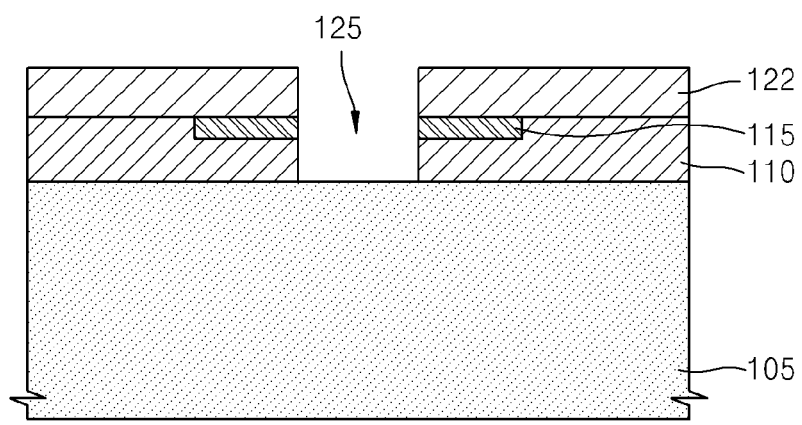
FIGS. 17 through 19 are cross-sectional views illustrating a method of fabricating a semiconductor chip according to another embodiment of the present general inventive concept.
Figure 18:
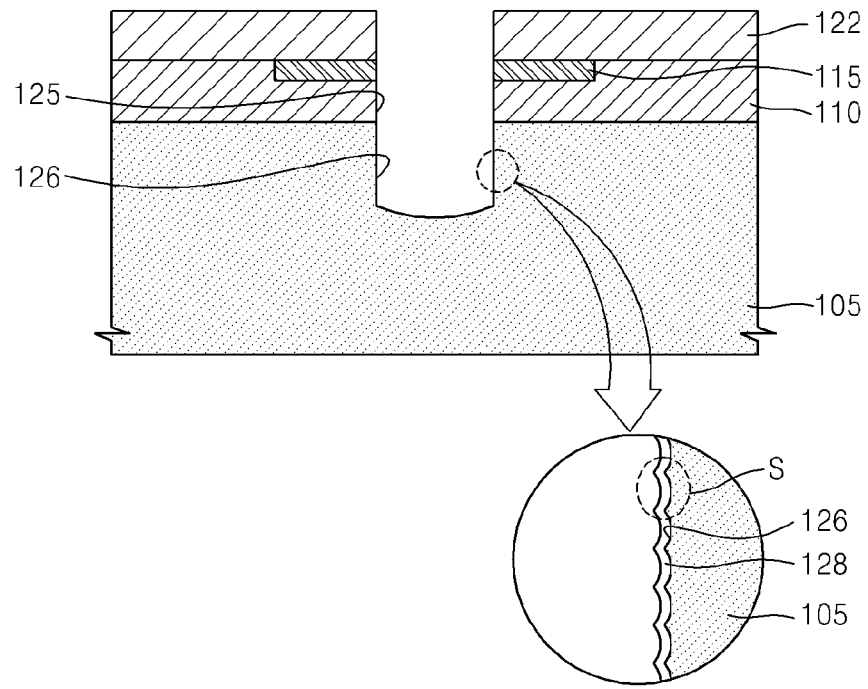
Figure 19:
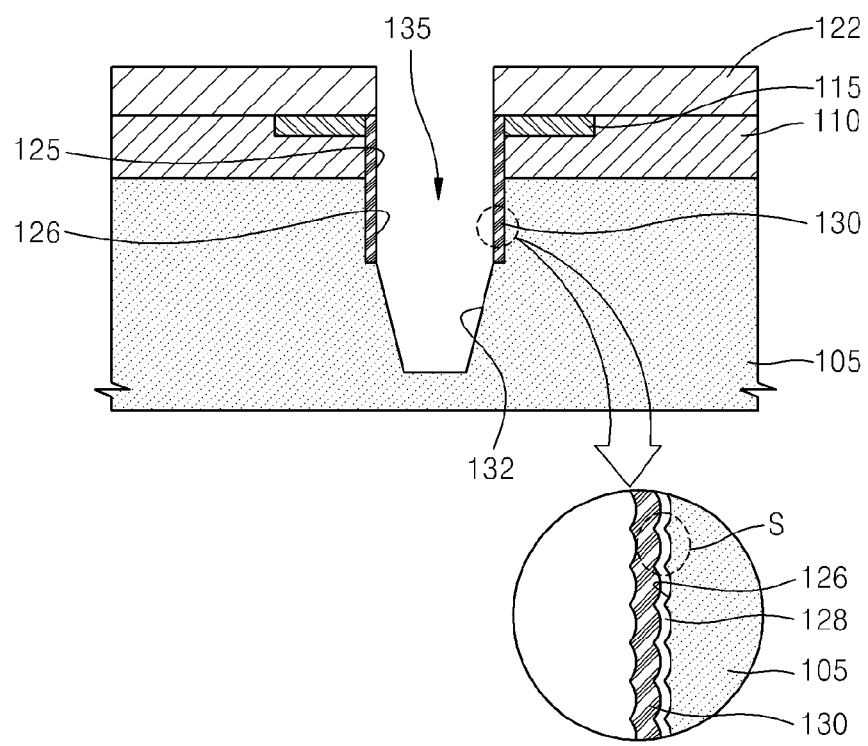

FIGS. 17 through 19 are cross-sectional views illustrating a method of fabricating a semiconductor chip according to another embodiment of the present general inventive concept. The method according to the present embodiment may be similar to the method that has been described with reference to FIGS. 10 through 16. Thus, the same description will be omitted herein.

Referring to FIG. 17, an insulating layer 110 may be formed on a substrate 105. The insulating layer 110 may be formed by deposition of an appropriate insulating layer, for example, by CVD. The insulating layer 110 may have a single-layered structure or a multi-layered structure. Selectively, the insulating layer 110 may be planarized after being deposited. The planarization may be performed by CMP or etch-back.

Then, an electrode pad 115 may be formed on the insulating layer 110. For example, the insulating layer 110 is etched to form a trench (not illustrated), the trench is filled with a conductive material to form a conductive layer (not illustrated), and then the conductive layer is planarized to form the electrode pad 115. As another example, the electrode pad 115 may be formed by forming a conductive layer on the insulating layer 110 and patterning the conductive layer.

Then, a mask layer 122 exposing a portion of the electrode pad 115 may be formed. Then, the electrode pad 115 and the insulating layer 110 are sequentially etched using the mask layer 122 as a protection layer to form a third portion 125 of a via hole (see 135 of FIG. 19). For example, the third portion 125 may be formed using a non-Bosch process. In addition, the third portion 125 may have a smooth inner surface.

Referring to FIG. 18, the substrate 105 is etched to a selected depth using the mask layer 122 as a protection layer, thereby forming a first portion 126 of the via hole (see 135 of FIG. 19). The first portion 126 may be disposed immediately under the third portion 125 such that the first portion 126 and the third portion 125 are aligned.

As described with reference to FIG. 10, the first portion 126 may be formed using the Bosch process. Thus, the first portion 126 has an inner surface having the scallop shape S, and a first passivation layer 128 may be formed on the inner surface of the first portion 126.

Referring to FIG. 19, a second passivation layer 130 is formed on the inner surface of the first portion 126 and an inner surface of third portion 125, and then the substrate 105 is further etched to form a second portion 132. The formation of the second passivation layer 130 may be understood by referring to the description above with reference to FIG. 11, and the formation of the second portion 132 may be understood by referring to the description above with reference to FIG. 12.

Then, the semiconductor chip of FIG. 6 is fabricated using the method that has been described with reference to FIGS. 13 through 16.

Figure 20:
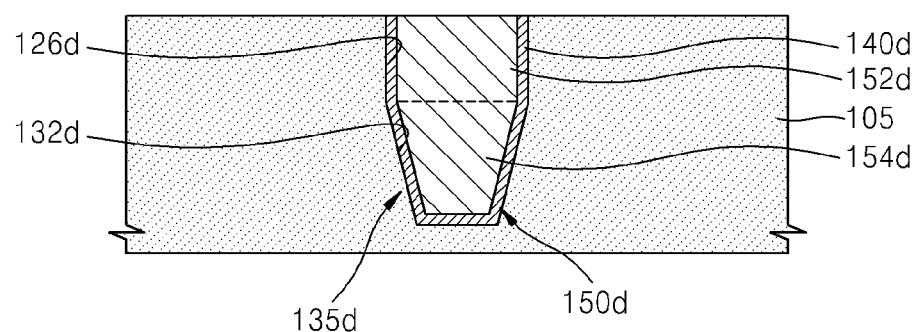
FIGS. 20 and 21 are cross-sectional views illustrating a method of fabricating a semiconductor chip according to another embodiment of the present general inventive concept.
Figure 21:
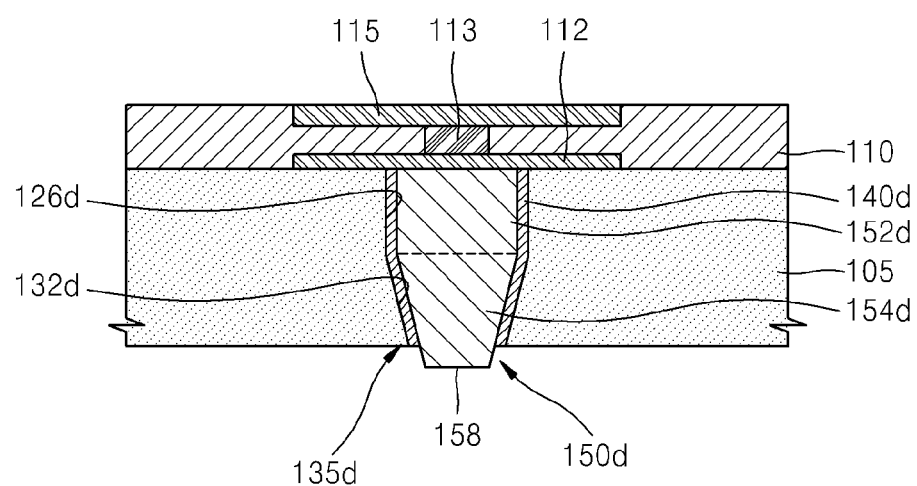

FIGS. 20 and 21 are cross-sectional views illustrating a method of fabricating a semiconductor chip according to another embodiment of the present general inventive concept. The method according to the present embodiment may be similar to the method that has been described with reference to FIGS. 10 through 16. Thus, the same description will be omitted herein.

Referring to FIG. 20, a via hole 135d is formed using the method that has been described with reference to FIGS. 10 through 14, a spacer insulating layer 140d is formed on an inner surface of the via hole 135d, and a via electrode 150d filling the via hole 135d is formed on the spacer insulating layer 140d. The via electrode 150d may be formed by further planarizing the via electrode 150 of FIG. 14. Thus, the formed via electrode 150d does not have any protrusion. Alternatively, the via hole 135d may be filled in without the protrusion 156 illustrated in FIG. 14 being formed, thus eliminating the operations of forming the protrusion and subsequent planarization of the protrusion.

Referring to FIG. 21, an interconnection layer 112 may be formed on the substrate 105. The interconnection layer 112 may be formed by forming a conductive layer (not illustrated) on the substrate 105 to be connected with the via electrode 150d and patterning the conductive layer. Then, the insulating layer 110 may be formed on the interconnection layer 112. Then, the insulating layer 110 is etched using a dual Damascene process to form a dual via hole (not illustrated), and the dual via hole is filled by a conductive material (not illustrated) to form a contact plug 113 and an electrode pad 115. The numbers of interconnection layers and contact plugs are not limited to the present embodiment.

Before the interconnection layer 112 is formed or after the electrode pad 115 is formed, a bottom portion of the substrate 105 is removed to expose the via electrode 150d (150d). However, the bottom portion of the substrate may also be removed after the interconnection layer 112 and the electrode pad 115 are formed.

According to the present embodiment, since the electrode pad 115 is formed after the via electrode 150d is formed, the via electrode 150d does not pass through the electrode pad 115 and also, the via electrode 150d and the electrode pad 115 are not directly connected to each other.

Meanwhile, to fabricate the semiconductor chip of FIG. 8, the method that has been described with reference to FIGS. 10 through 14 is performed on a second surface of the substrate 105, and then the interconnection layer 12 and electrode pad 115 of FIG. 21 are formed thereon.

Figure 22:
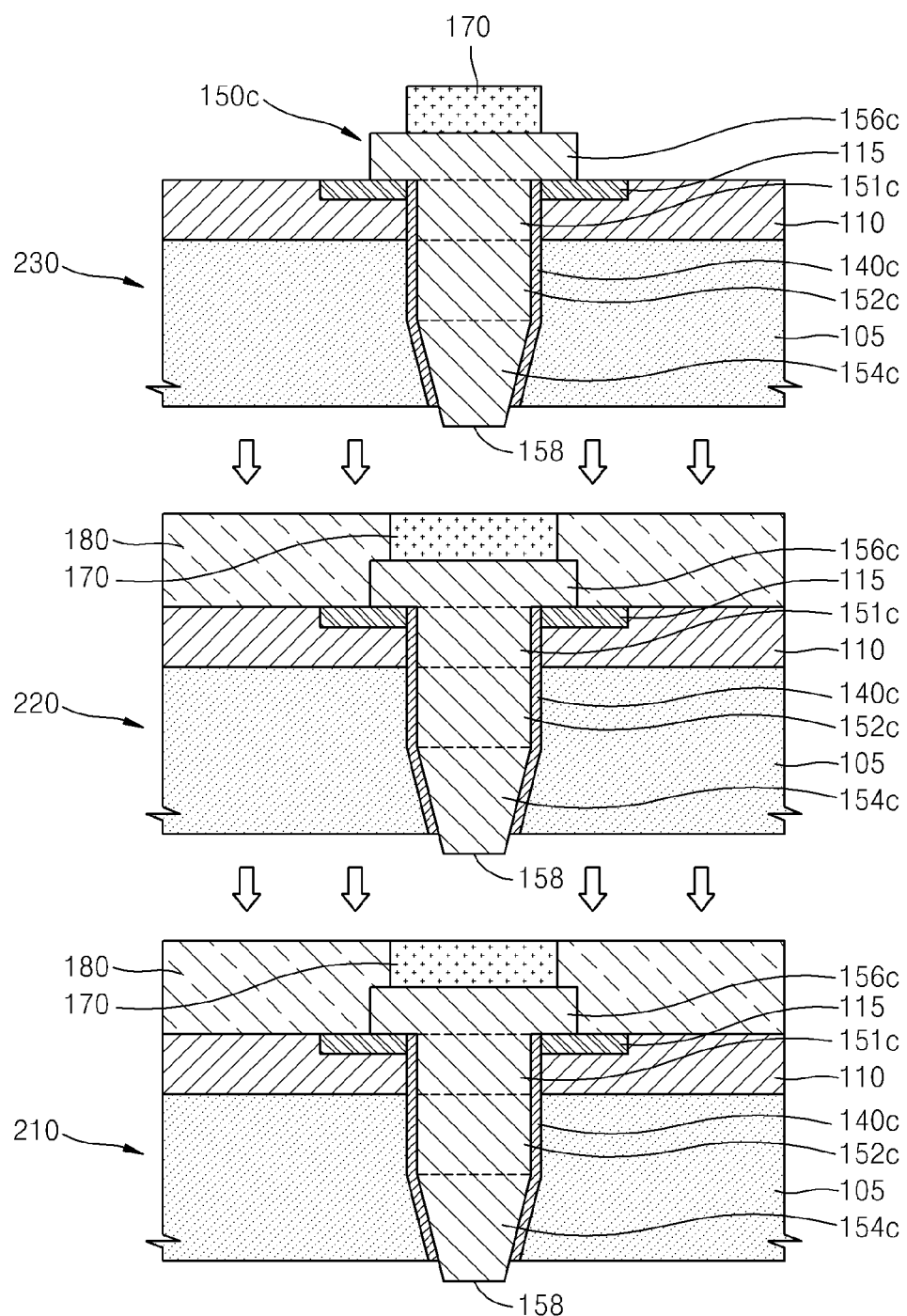
FIGS. 22 through 23 are cross-sectional views illustrating a method of fabricating a stack module according to an embodiment of the present general inventive concept.
Figure 23:
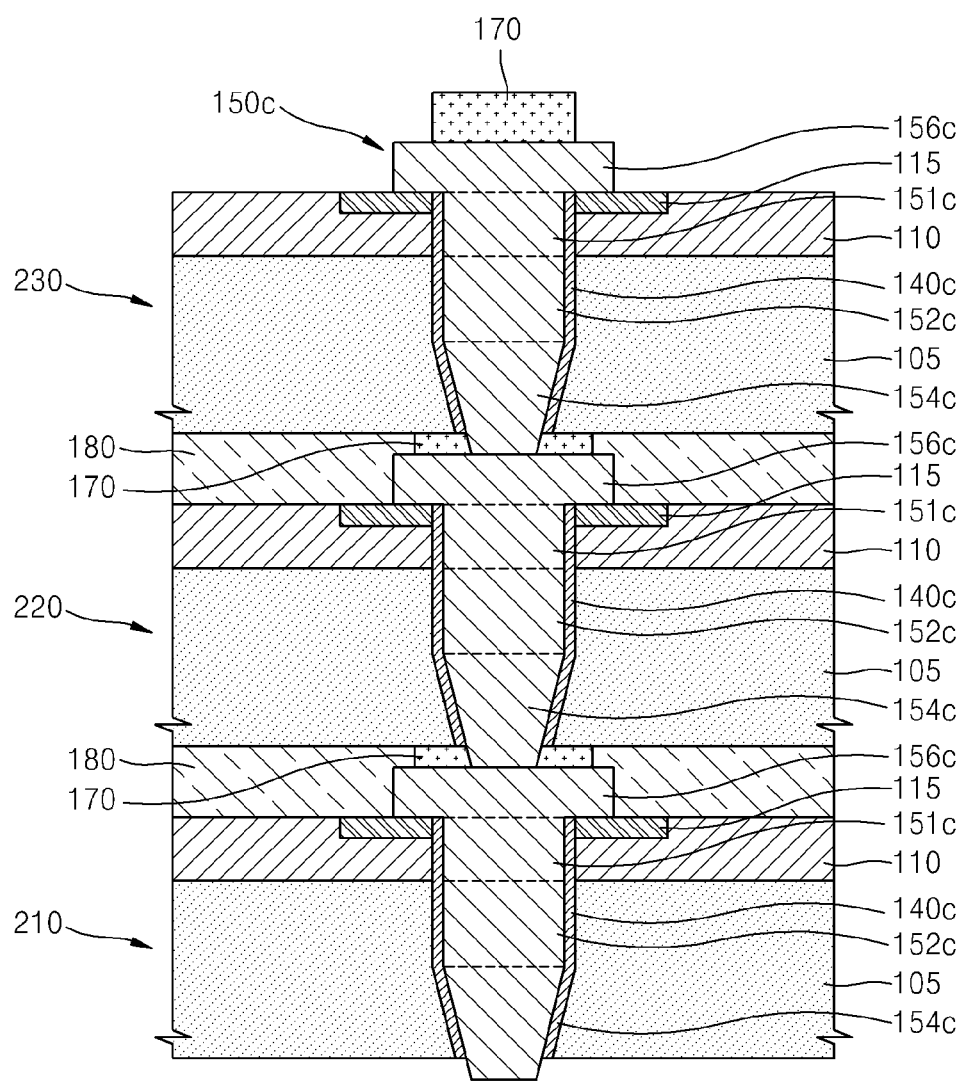

FIGS. 22 through 23 are cross-sectional views illustrating a method of fabricating a stack module according to an embodiment of the present general inventive concept.

Referring to FIG. 22, semiconductor chips 210, 220, and 230 may be stacked by interposing adhesive layers 180 between the semiconductor chips 210, 220, and 230. A second protrusion 158 of the semiconductor chip 230 is disposed on a bump layer 170 of the semiconductor chip 220, and a second protrusion 158 of the semiconductor chip 220 is disposed on a bump layer 170 of the semiconductor chip 210. The numbers or quantity of the semiconductor chips are exemplary and are not limited to the present embodiment.

Referring to FIG. 23, the semiconductor chips 210, 220, and 230 may be attached to each other by compression. In this case, the second protrusion 158 of the semiconductor chip 230 may pass through the bump layer 170 of the semiconductor chip 220 and may be directly connected to a protrusion portion 156c of the semiconductor chip 220. Likewise, the second protrusion 158 of the semiconductor chip 220 may pass through the bump layer 170 of the semiconductor chip 210 and may be directly connected to a protrusion portion 156c of the semiconductor chip 210. Thus, the semiconductor chips 210, 220, and 230 are electrically connected to each other. Alternatively, a hole may be etched or otherwise cut away in the bump layers 170 for insertion of the second protrusions into the bump layers to make electrical connection with the protrusions 156c.

In other embodiments, the second protrusion 158 of the semiconductor chip 230 may be inserted into the bump layer 170 of the semiconductor chip 220 and may not be directly connected to the protrusion portion 156c of the semiconductor chip 220. Likewise, the second protrusion 158 of the semiconductor chip 220 may be inserted into the bump layer 170 of the semiconductor chip 210 and may not be directly connected to the protrusion portion 156c of the semiconductor chip 210.

Figure 24:
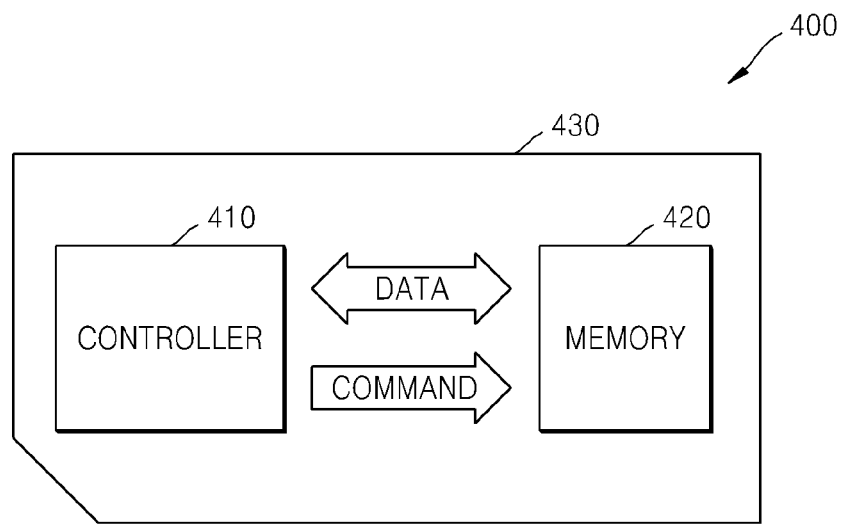
FIG. 24 is a schematic view illustrating a card according to an embodiment of the present general inventive concept.

FIG. 24 is a schematic view illustrating a card 400 according to an embodiment of the present general inventive concept.

Referring to FIG. 24, the card 400 may include a controller unit 410, a memory unit 420, and a housing 430 including the controller unit 410 and the memory unit 420. The controller unit 410 and the memory unit 420 may exchange electrical signals with each other. For example, according to a command of the controller unit 410, the memory unit 420 and the controller unit 410 may exchange data. Thus, the card 400 can store data in the memory unit 420 or output the data stored in the memory unit 420 to the outside.

For example, the memory unit 420 may include at least one selected from the group consisting of the semiconductor chips and the stack module described above. The card 400 may be used as a data storage medium of various portable devices. For example, the card 400 may include a multi media card (MMC) or a secure digital (SD) card.

Figure 25:
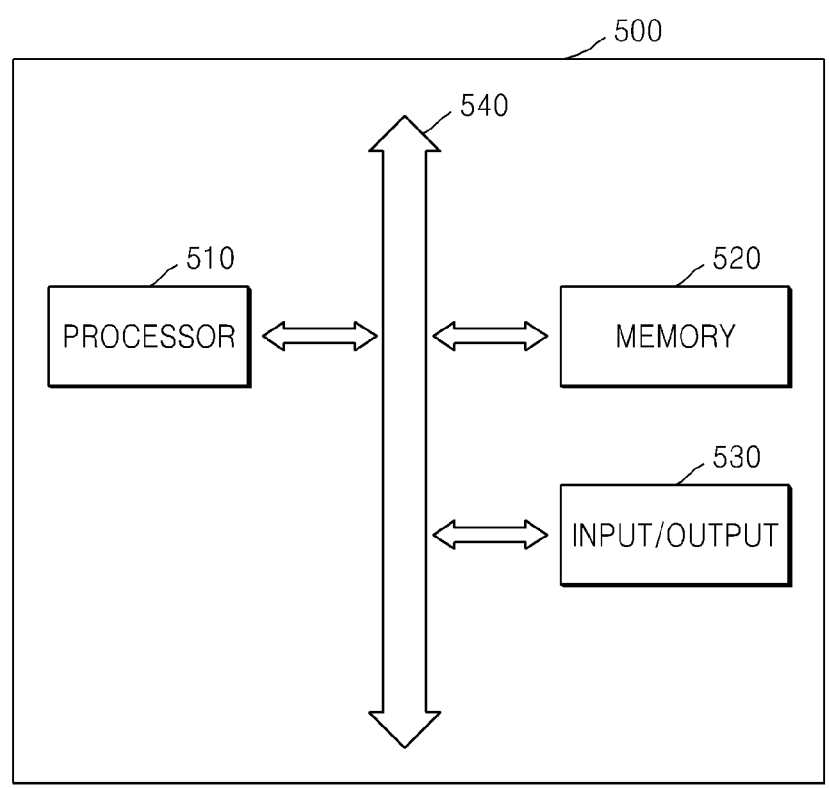
FIG. 25 is a block diagram illustrating an electronic system according to an embodiment of the present general inventive concept.

FIG. 25 is a block diagram illustrating an electronic system 500 according to an embodiment of the present general inventive concept.

Referring to FIG. 25, the electronic system 500 may include a processor unit 510, an input/output unit 530, and a memory unit 520. The processor unit 510, the input/output unit 530, and the memory unit 520 exchange data via a bus 540. The processor unit 510 executes a program and controls the electronic system 500. The input/output unit 530 may input to or output data from the electronic system 500. The electronic system 500 may be connected to an external apparatus via the input/output unit 530 so that the electronic system 500 and the external apparatus may exchange data with each other. The external apparatus may be, for example, a personal computer or a network. The memory unit 520 may store codes and data to operate the processor unit 510. For example, the memory unit 520 may include at least one selected from the group consisting of the semiconductor chips and the stack module described above.

For example, the electronic system 500 may be used in any of various electronic control apparatuses requiring the memory unit 520. Examples of such electronic control apparatuses include a mobile phone, a MP3 player, a navigation device, a solid state disk (SSD), and household appliances.

Figure 26A:
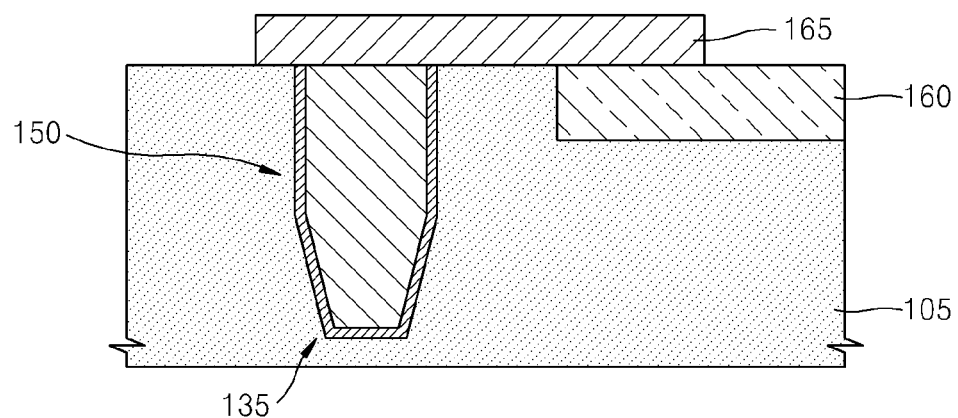
FIGS. 26A and 26B are cross-sectional views illustrating exemplary uses of the via electrode connected to integrated circuitry according to embodiments of the present general inventive concept.
Figure 26B:
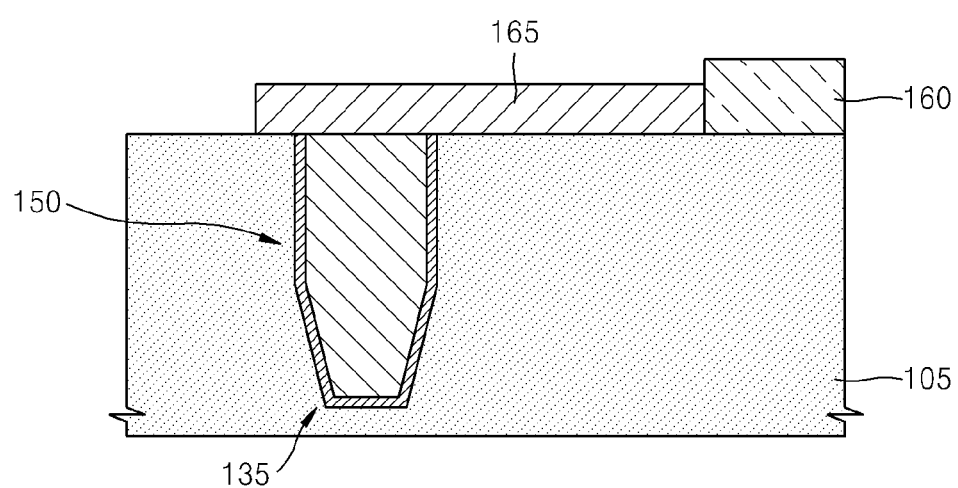

FIGS. 26A and 26B illustrate additional uses for the via hole 135b. As discussed herein, the via electrode 150 may connect to one or a plurality of integrated circuits 160 through an interconnection line 165. The integrated circuit 160 may be formed within the substrate 105, atop the substrate 105, or some combination thereof. The substrate 105 has a main body defined by the first surface 101 and the second surface 102. Thus, an integrated circuit 160 may be formed on the main body and connected to the via electrode 150 as illustrated in the figures.

While the present general inventive concept has been particularly illustrated and described with reference to exemplary embodiments thereof, it will be understood that various changes in form and details may be made therein without departing from the spirit and scope of the following claims.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A semiconductor chip comprising:
   a semiconductor substrate comprising a first surface and a second surface facing the first surface;
   at least one via hole comprising a first portion extending in a direction from the first surface of the substrate to the second surface of the substrate and a second portion that is connected to the first portion and has a tapered shape; and
   at least one via electrode filling the at least one via hole,
   wherein the first portion of the at least one via hole has an inner surface having a scallop shape of a plurality of extended and connected convex and concave portions, a plurality of convex portions connected to each other in series, or a plurality of concave portions connected in series.

2. The semiconductor chip of claim 1, wherein the at least one via hole extends perpendicularly to the first and second surfaces of the substrate.

3. The semiconductor chip of claim 1, wherein the at least one via electrode comprises a first filling portion and a second filling portion to respectively correspond to the first portion and second portion of the at least one via hole, and the second filling portion has a periphery having a scallop shape.

4. The semiconductor chip of claim 3, wherein the at least one via electrode further comprises a protrusion portion connected to the first filling portion on the substrate.

5. The semiconductor chip of claim 1, further comprising an insulating layer on the first surface of the substrate,
   wherein the at least one via hole further comprises a third portion that is connected to the first portion and extends through the insulating layer.

6. The semiconductor chip of claim 5, wherein the second and third portions of the at least one via hole have smooth inner surfaces, and the first portion has an inner surface having a scallop shape.

7. The semiconductor chip of claim 5, further comprising at least one electrode pad on the insulating layer,
   wherein the at least one via electrode extends through the at least one electrode pad.

8. The semiconductor chip of claim 7, wherein the at least one via electrode contacts a top surface of the at least one electrode pad.

9. The semiconductor chip of claim 1, further comprising a spacer insulating layer between the substrate and the at least one via electrode.

10. The semiconductor chip of claim 1, wherein the at least one via electrode perpendicularly passes through the substrate.

11. The semiconductor chip of claim 8, wherein the at least one via electrode protrudes from the second surface of the substrate.

12. A stack module comprising a plurality of semiconductor chips stacked, wherein each of the semiconductor chips comprises:
a semiconductor substrate comprising a first surface and a second surface facing the first surface;
at least one via hole comprising a first portion extending in a direction from the first surface of the substrate to the second surface of the substrate and a second portion that is connected to the first portion and has a tapered shape; and
at least one via electrode filling the at least one via hole, and the at least one via electrode of each of the semiconductor chips is connected to the at least one via electrode of an adjacent semiconductor chip,
wherein the first portion of the at least one via hole has an inner surface having a scallop shape of a plurality of extended and connected convex and concave portions, a plurality of convex portions connected to each other in series, or a plurality of concave portions connected in series.

13. The stack module of claim 12, wherein each of the semiconductor chips further comprises at least one electrode pad disposed on the first surface of the substrate, and
the at least one via electrode extends through the at least one electrode pad.

14. The stack module of claim 12, wherein each of the semiconductor chips further comprises a bump layer disposed on the at least one via electrode, and
the at least one via electrode of each of the semiconductor chips extends through the bump layer of an adjacent semiconductor chip under the semiconductor chip.

15. A card apparatus comprising:
a housing;
a memory unit in the housing; and
a controller unit in the housing to be configured to control the memory unit,
wherein the memory unit comprises:
a semiconductor substrate comprising a first surface and a second surface facing the first surface;
at least one via hole comprising a first portion extending in a direction from the first surface of the substrate to the second surface of the substrate and a second portion that is connected to the first portion and has a tapered shape, becoming thinner away from the first portion; and
at least one via electrode filling the at least one via hole,
wherein the first portion of the at least one via hole has an inner surface having a scallop shape of a plurality of extended and connected convex and concave portions, a plurality of convex portions connected to each other in series, or a plurality of concave portions connected in series.

16. A method of fabricating a semiconductor chip, the method comprising:
forming at least one via hole extending in a direction from a first surface of a substrate to a second surface of the substrate; and
forming at least one via electrode filling the at least one via hole,
wherein the forming of the at least one via hole comprises:
forming a first portion extending from the first surface of the substrate into the substrate and forming a first passivation layer on an inner surface of the first portion; and
forming a second portion that extends from the first portion toward the second surface of the substrate and has a tapered shape, and
wherein the first portion of the at least one via hole has an inner surface having a scallop shape of a plurality of extended and connected convex and concave portions, a plurality of convex portions connected to each other in series, or a plurality of concave portions connected in series.

17. The method of claim 16, wherein the first portion is formed substantially perpendicularly to the first surface of the substrate by using a Bosch process, wherein the Bosch process is performed by repeating deposition and etching.

18. The method of claim 16, before the second portion of the at least one via hole is formed, further comprising forming a second passivation layer on the first passivation layer, wherein the second passivation layer is thicker than the first passivation layer.

19. The method of claim 18, wherein each of the first passivation layer and the second passivation layer comprises a polymer layer.

20. The method of claim 16, further comprising forming at least one electrode pad on the first surface of the substrate,
wherein the at least one via hole further comprises a third portion connected to the first portion and passes through the at least one electrode pad.

21. The method of claim 16, before the at least one via electrode is formed, further comprising forming a spacer insulating layer on a surface of the substrate inside the at least one via hole.

22. The method of claim 16, further comprising exposing an end of the at least one via electrode by the second surface of the substrate.

23. The semiconductor chip of claim 4, wherein the protrusion portion protrudes atop the first surface of the substrate.

24. A semiconductor chip, comprising:
a semiconductor substrate having a main body defined by a first surface and a second surface; and
a via hole formed in the main body and having a width variable along a direction from the first surface to the second surface,
wherein the via hole further comprises first wall portions adjacent the first surface that include a plurality of connected convex indentations,
wherein the via hole further comprises second wall portions having a flat surface, the second wall portions disposed closer to the second surface than the first surface and wherein the via hole passes through both the first surface and the second surface and includes a filling to fill the via hole and protrude from both surfaces.

25. The semiconductor chip of claim 24, further comprising:
a via electrode to fill the via hole.

26. The semiconductor chip of claim 25, further comprising:
an integrated circuit formed on the main body and connected to the via electrode.

27. The semiconductor chip of claim 24, wherein the via hole further comprises:
a first portion formed adjacent the first surface of the substrate, the first portion having a first width that is narrower towards the first surface than the second surface; and
a second portion disposed closer to the second surface than the first portion, the second portion having a second width that is narrower toward the second surface than the first surface, the second width being more narrow than the first width.

28. A semiconductor chip comprising:
a semiconductor substrate comprising a first surface having an insulating layer thereon and a second surface facing the first surface;
at least one via hole comprising a first portion extending in a direction from the first surface of the substrate to the second surface of the substrate, a second portion that is connected to the first portion and has a tapered shape, and a third portion that is connected to the first portion and extends through the insulating layer; and
at least one via electrode filling the at least one via hole,
wherein the first portion of the at least one via hole has an inner surface having a scallop shape and the second and third portions of the at least one via hole have smooth inner surfaces.

* * * * *